(12) United States Patent  
Wang et al.

(10) Patent No.: US 9,166,547 B2  
(45) Date of Patent: Oct. 20, 2015

(54) ELECTRONIC DEVICE AND METHOD FOR ADJUSTING VOLUME LEVELS OF AUDIO SIGNAL OUTPUTTED BY THE ELECTRONIC DEVICE

(71) Applicant: ShenZhen Goldsun Network Intelligence Technology Co., Ltd., ShenZhen (CN)

(72) Inventors: Xin-Shu Wang, Wuhan (CN); Jian-Hung Hung, New Taipei (TW); Min Yang, Wuhan (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 151 days.

(21) Appl. No.: 14/086,996

(22) Filed: Nov. 22, 2013

(65) Prior Publication Data

US 2014/0169587 A1    Jun. 19, 2014

(30) Foreign Application Priority Data

Dec. 13, 2012    (CN) .................. 2012 1 05446679

(51) Int. Cl.
```
H03G 3/00      (2006.01)
H03G 11/00     (2006.01)
H03G 3/32      (2006.01)
H03G 3/30      (2006.01)
H03G 3/20      (2006.01)
```

(52) U.S. Cl.  
CPC ............ *H03G 11/002* (2013.01); *H03G 3/32* (2013.01); *H03G 3/20* (2013.01); *H03G 3/301* (2013.01)

(58) Field of Classification Search  
CPC .......... H03G 3/32; H03G 3/20; H03G 3/301; H03G 11/002  
USPC ..................... 381/107, 57, 104, 56  
See application file for complete search history.

(56) References Cited

U.S. PATENT DOCUMENTS 5,666,426 A *    9/1997    Helms .............................. 381/57

\* cited by examiner

*Primary Examiner* — Paul S Kim  
(74) *Attorney, Agent, or Firm* — Novak Druce Connolly Bove + Quigg LLP

(57) ABSTRACT

An electronic device includes an audio sensor, an audio output unit, a pulse width modulation (PWM) unit connected to the audio output unit, and a control chip. When the audio output unit outputs the audio signal, the audio sensor detects a volume level of the environment sound. The control chip determines a volume level of the audio signal according to the volume level of the environment sound and preset associations between volume levels of the audio signal outputted by the audio output unit and volume levels of the environment, and determines a duty cycle of the PWM unit according to the determined volume level and the maximum volume level. The control chip then outputs the duty cycle to the PWM unit, to adjust a current volume level of the audio signal outputted by the audio output unit to the determined volume level.

12 Claims, 2 Drawing Sheets

ELECTRONIC DEVICE AND METHOD FOR ADJUSTING VOLUME LEVELS OF AUDIO SIGNAL OUTPUTTED BY THE ELECTRONIC DEVICE

BACKGROUND

1. Technical Field

Embodiments of the present disclosure relate to device controlling systems and methods, and more particularly to an electronic device and a method for adjusting volume levels of an audio signal outputted by the electronic device.

2. Description of Related Art

When users use electronic devices (e.g., mobile phones, computers) to enjoy audio programs, such as listening to music or broadcast programs, due to changes in ambient noise the users may have to frequently adjust volume levels of the electronic devices. Therefore, there is room for improvement.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

In general, the word "module", as used herein, refers to logic embodied in hardware or firmware, or to a collection of software instructions, written in a programming language. One or more software instructions in the modules may be embedded in firmware, such as in an erasable programmable read only memory (EPROM). The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
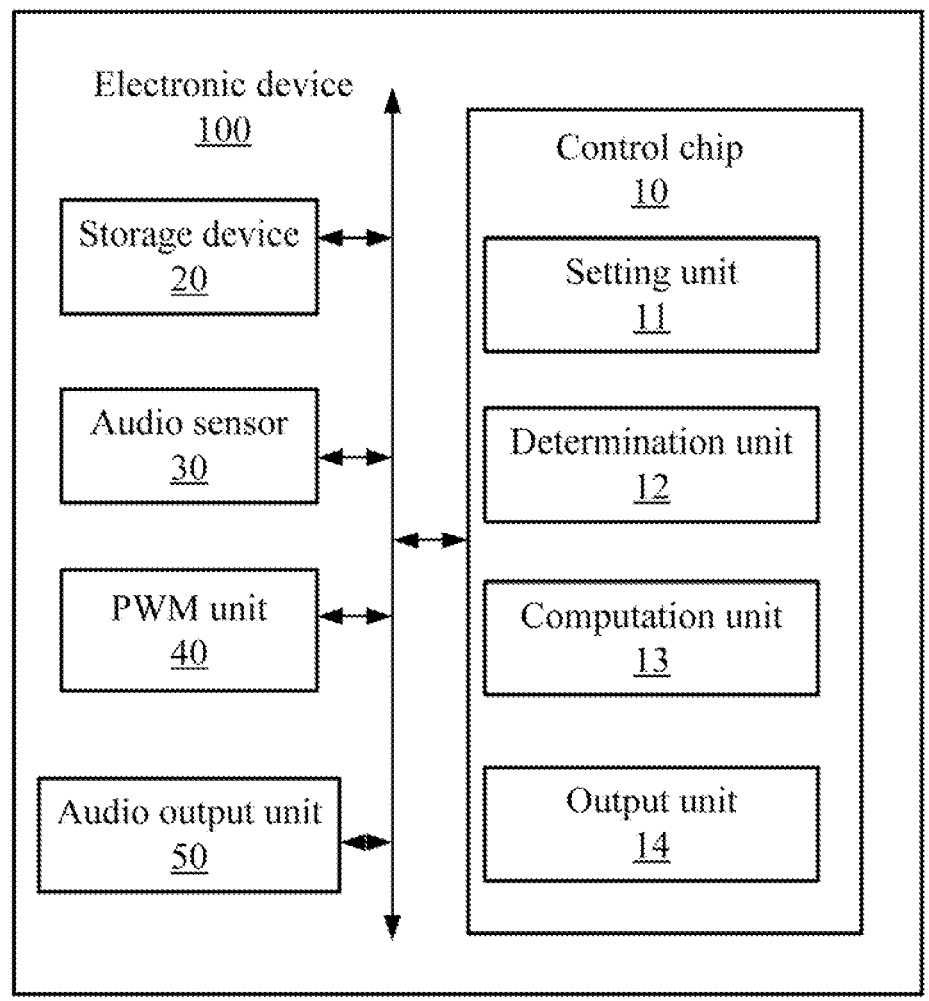
FIG. 1 is a block diagram of one embodiment of an electronic device.

FIG. 1 is a block diagram of one embodiment of an electronic device 100. Depending on the embodiment, the electronic device 100 may be a computer, a smart television, a mobile phone, MP3, or MP4, for example. The electronic device 100 includes a control chip 10, a storage device 20, an audio sensor 30, a pulse width modulation (PWM) unit 40, and an audio output unit 50. The audio output unit 50 may be a speaker. The components 10-50 connect and communicate with each other via a system bus. One of ordinary skill in the art would understand/recognize that, the electronic device 100 may be configured in a number of other ways and may include other or different components.

The control chip 10 includes a setting unit 11, a determination unit 12, a computation unit 13, and an output unit 14. The units 11-14 include computerized code in the form of one or more programs. The control chip 10 may include a processor (not shown) that executes the computerized code.

The setting unit 11 sets associations between volume levels of an audio signal outputted by the audio output unit 50 and volume levels of an environment sound, and sets a maximum volume level bearable to users. In one embodiment, the environment sound includes any sound that causes interference to a user of the electronic device 100 who is listening to the audio signal (i.e., audio data) outputted by the audio output unit 50. It is noted that the settings in relation to the volume levels here may not cause damage to human hearing. For example, sounds that are louder than 85 dBs may cause permanent hearing loss to human, so that the maximum volume level should be set not more than 85 dBs.

The associations may be set as follows: on condition that a volume level of the audio signal outputted by the audio output unit 50 is less than a first threshold (e.g., 55 dB), when every time a volume level of the environment sound is increased by a first value (e.g. 1 dB), increasing the volume level of the audio signal outputted by the audio output unit 50 by a second value (e.g., 2 dBs). The associations may further include: when every time the volume level of the environment sound is decreased by a third value (e.g., 1.5 dBs), decreasing the volume level of the audio signal outputted by the audio output unit 50 by a fourth value (e.g., 1 dB). The associations may further include: on condition that the volume level of the environment sound is more than the volume level of the audio signal outputted by the audio output unit 50, and the volume level of the audio signal outputted by the audio output unit 50 is less than a second threshold (e.g., 60 dBs), adjusting the volume level to be a fifth value (e.g., 65 dBs). It is noted that, the first, second, third, fourth and fifth values may be set as the same or different, and the first threshold and the second threshold may be set as the same or different. The associations are stored in the storage device 20.

When the audio output unit 50 outputs the audio signal (e.g., audio data), the audio sensor 30 detects the volume level of the environment sound surrounding the electronic device 100, and transmits the volume level of the environment sound to the control chip 10. The control chip 10 determines a volume level of the audio signal outputted by the audio output unit 50 according to the volume level of the environment sound and the associations. For example, a current volume level of the audio signal outputted by the audio output unit 50 is 30 dBs, a current volume level of the environment sound increases 1 dB compared to a previous volume level of the environment sound, according to the associations, the volume level of the audio signal outputted by the audio output unit 50 should increase 2 dBs. Therefore, the control chip 10 determines that the volume level of the audio signal outputted by the audio output unit 50 should be adjusted to 32 dBs.

The computation unit 13 determines a ratio of the determined volume level of the audio signal outputted by the audio output unit 50 to the maximum volume level bearable to users, and takes the ratio as a duty cycle of the PWM unit 40. The output unit 14 outputs the duty cycle to the PWM unit 40, and adjusts the current volume level (e.g., 30 dBs) of the audio signal outputted by the audio output unit 50 to the determined volume level (e.g., 32 dBs) by the PWM unit 40.

Figure 2:
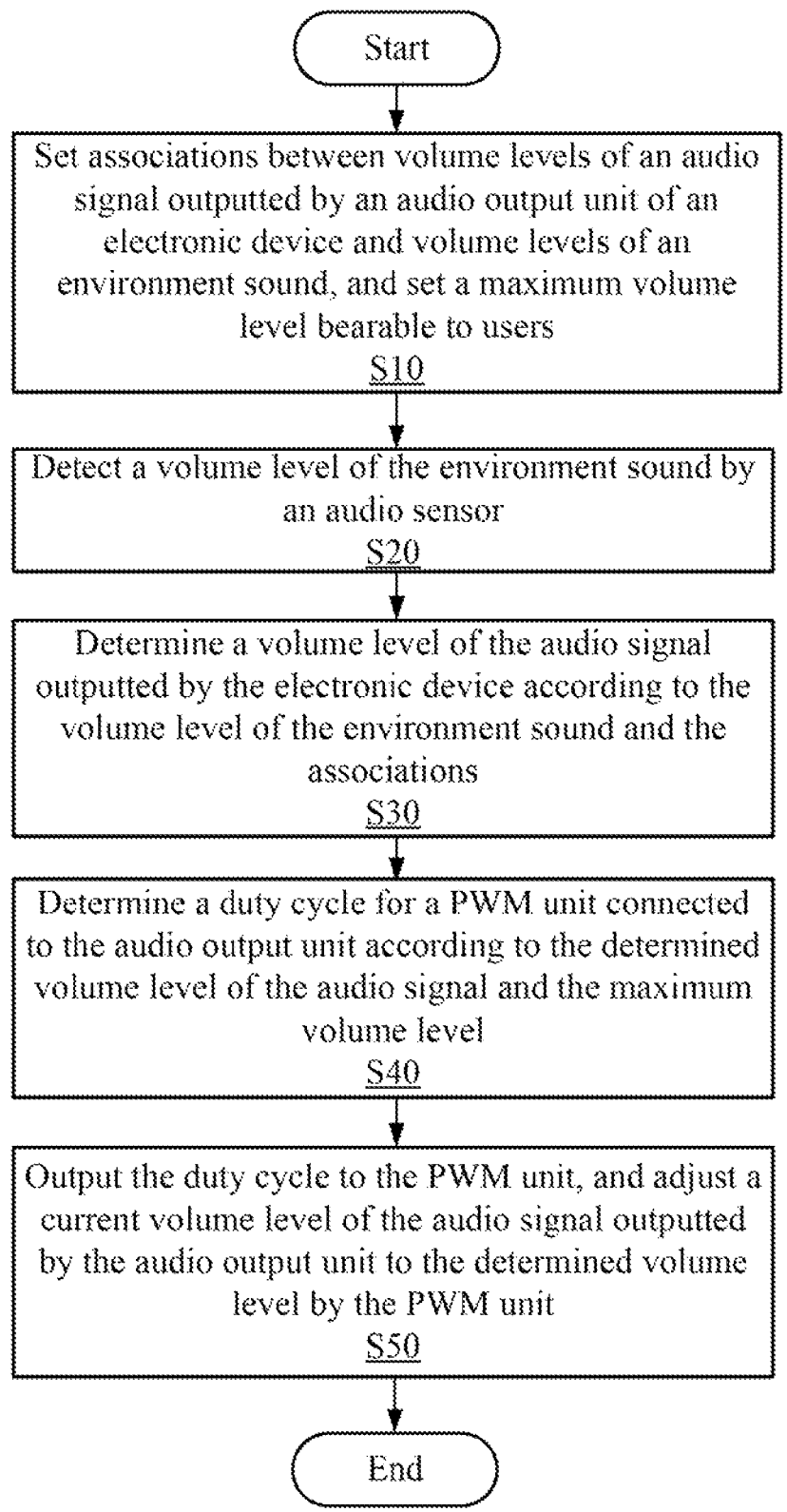
FIG. 2 is a block diagram of one embodiment of a method for adjusting volume levels of an audio signal outputted by the electronic device of FIG. 1.

FIG. 2 is a block diagram of one embodiment of a method for adjusting volume levels of the audio signal outputted by the electronic device 1 of FIG. 1. Depending on the embodiment, additional steps may be added, others removed, and the ordering of the steps may be changed.

Step S10, the setting unit 11 sets associations between volume levels of an audio signal outputted by the audio output unit 50 and volume levels of an environment sound, and sets a maximum volume level bearable to users. For example, the maximum volume level bearable to users may be set as 85 dBs. The associations include increasing/decreasing a volume level of the audio signal outputted by the audio output unit 50 in response to increase/decrease of a volume level of the environment sound. For details about the associations, please refer to the above descriptions.

Step S20, when the audio output unit 50 outputs the audio signal (e.g., music), the audio sensor detects a volume level of an environment sound surrounding the electronic device 100, and transmits the volume level of the environment sound to the control chip 10.

Step S30, the determination unit 12 determines a volume level of the audio signal outputted by the audio output unit 50 according to the volume level of the environment sound and the associations. For example, a current volume level of the audio signal outputted by the audio output unit 50 is 30 dBs, and a current volume level of the environment sound increases 1 dB compared to a previous volume level of the environment sound. On condition that the volume level of the audio signal outputted by the audio output unit 50 should increase 2 dBs when the volume level of the environment sound increase 1 dB according to the associations, the determination unit 12 determines that the volume level of the audio signal outputted by the audio output unit 50 should be adjusted from 30 dBs to 32 dBs.

Step S40, the computation unit 13 determines a duty cycle for the PWM unit 40 according to the determined volume level of the audio signal and the maximum volume level. In this embodiment, the computation unit 13 determines a ratio of the determined volume level of the audio signal outputted by the audio output unit 50 to the maximum volume level bearable to users, and takes the ratio as the duty cycle of the PWM unit 40.

Step S50, the output unit 14 outputs the duty cycle to the PWM unit 40, to control the PWM unit 40 to adjust the current volume level (e.g., 30 dBs) of the audio signal outputted by the audio output unit 50 to the determined volume level (e.g., 32 dBs).

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A method for adjusting volume levels of an audio signal outputted by an electronic device, comprising:
   setting associations between volume levels of an audio signal outputted by an audio output unit of the electronic device and volume levels of an environment sound, and setting a maximum volume level bearable to users;
   receiving a volume level of the environment sound detected by an audio sensor of the electronic device when the audio output unit outputs the audio signal;
   determining a volume level of the audio signal outputted by the audio output unit according to the volume level of the environment sound and the associations;
   determining a duty cycle of a pulse width modulation (PWM) unit connected to the audio output unit according to the determined volume level of the audio signal and the maximum volume level bearable to users; and
   outputting the duty cycle to the PWM unit to adjust a current volume level of the audio signal to the determined volume level.

2. The method as claimed in claim 1, wherein the associations comprise: when a volume level of the audio signal outputted by the audio output unit is less than a first threshold, in response to a volume level of the environment sound being increased by a first value, increasing the volume level of the audio signal outputted by the audio output unit by a second value.

3. The method as claimed in claim 1, wherein the associations comprise: in response to the volume level of the environment sound being decreased by a third value, decreasing the volume level of the audio signal outputted by the audio output unit by a fourth value.

4. The method as claimed in claim 1, wherein the associations comprise: when the volume level of the environment sound is more than the volume level of the audio signal outputted by the audio output unit, and the volume level of the audio signal outputted by the audio output unit is less than a second threshold, adjusting the volume level to be a fifth value.

5. An electronic device, comprising:
   an audio sensor;
   an audio output unit;
   a pulse width modulation (PWM) unit connected to the audio output unit; and
   a control chip that comprises one or more programs, when executed by a processor of the electronic device, causing the processor to perform operations of:
   setting associations between volume levels of an audio signal outputted by the audio output unit and volume levels of an environment sound, and setting a maximum volume level bearable to users;
   receiving a volume level of the environment sound detected by the audio sensor when the audio output unit outputs the audio signal;
   determining a volume level of the audio signal outputted by the audio output unit according to the volume level of the environment sound and the associations;
   determining a duty cycle of the PWM unit according to the determined volume level of the audio signal and the maximum volume level bearable to users; and
   outputting the duty cycle to the PWM unit to adjust a current volume level of the audio signal to the determined volume level.

6. The electronic device as claimed in claim 5, wherein the associations comprise: when a volume level of the audio signal outputted by the audio output unit is less than a first threshold, in response to a volume level of the environment sound being increased by a first value, increasing the volume level of the audio signal outputted by the audio output unit by a second value.

7. The electronic device as claimed in claim 5, wherein the associations comprise: in response to the volume level of the environment sound being decreased by a third value, decreasing the volume level of the audio signal outputted by the audio output unit by a fourth value.

8. The electronic device as claimed in claim 5, wherein the associations comprise: when the volume level of the environment sound is more than the volume level of the audio signal outputted by the audio output unit, and the volume level of the audio signal outputted by the audio output unit is less than a second threshold, adjusting the volume level to be a fifth value.

9. A control chip of an electronic device having stored thereon instructions that causes the control chip to perform operations:
   setting associations between volume levels of an audio signal outputted by an audio output unit of the electronic device and volume levels of an environment sound, and setting a maximum volume level bearable to users;
   receiving a volume level of the environment sound detected by a audio sensor of the electronic device when the audio output unit outputs the audio signal;

determining a volume level of the audio signal output by the audio output unit according to the volume level of the environment sound and the associations;

determining a duty cycle of a pulse width modulation (PWM) unit connected to the audio output unit according to the determined volume level of the audio signal and the maximum volume level bearable to users; and outputting the duty cycle to the PWM unit to adjust a current volume level of the audio signal to the determined volume level.

10. The control chip as claimed in claim 9, wherein the associations comprise: when a volume level of the audio signal outputted by the audio output unit is less than a first threshold, in response to a volume level of the environment sound being increased by a first value, increasing the volume level of the audio signal outputted by the audio output unit by a second value.

11. The control chip as claimed in claim 9, wherein the associations comprise: in response to the volume level of the environment sound being decreased by a third value, decreasing the volume level of the audio signal outputted by the audio output unit by a fourth value.

12. The control chip as claimed in claim 9, wherein the associations comprise: when the volume level of the environment sound is more than the volume level of the audio signal outputted by the audio output unit, and the volume level of the audio signal outputted by the audio output unit is less than a second threshold, adjusting the volume level to be a fifth value.

* * * * *